United States Patent
Sugita et al.

(10) Patent No.: US 12,154,649 B2
(45) Date of Patent: Nov. 26, 2024

(54) SEMICONDUCTOR DEVICE

(71) Applicant: KIOXIA CORPORATION, Tokyo (JP)

(72) Inventors: Masato Sugita, Kanagawa (JP); Naoki Kimura, Kanagawa (JP); Daisuke Kimura, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/347,517

(22) Filed: Jul. 5, 2023

(65) Prior Publication Data

US 2023/0343371 A1  Oct. 26, 2023

Related U.S. Application Data

(63) Continuation of application No. 17/565,713, filed on Dec. 30, 2021, now Pat. No. 11,735,230, which is a
(Continued)

(30) Foreign Application Priority Data

Feb. 23, 2011 (JP) .................................. 2011-37344

(51) Int. Cl.
*G11C 5/02* (2006.01)
*G06F 13/42* (2006.01)
(Continued)

(52) U.S. Cl.
CPC ............ *G11C 5/04* (2013.01); *G06F 13/4282* (2013.01); *G06F 16/9535* (2019.01); *G11C 5/02* (2013.01);
(Continued)

(58) Field of Classification Search
CPC ....... G11C 5/063; G11C 7/18; G11C 11/4097; G11C 5/025; G11C 5/04
(Continued)

(56) References Cited

U.S. PATENT DOCUMENTS 5,661,677 A   8/1997  Rondeau, II et al.
6,011,741 A   1/2000  Wallace et al.
(Continued)

FOREIGN PATENT DOCUMENTS

JP   H07-283836 A   10/1995
JP   07-325898      12/1995
(Continued)

OTHER PUBLICATIONS

Office Action issued Jul. 8, 2014 in Japanese Patent Application No. 2013-217607 with English language translation.
(Continued)

*Primary Examiner* — Son T Dinh
(74) *Attorney, Agent, or Firm* — Oblon, McClelland, Maier & Neustadt, L.L.P.

(57) ABSTRACT

According to an embodiment, a semiconductor device includes a substrate, a connector, a volatile semiconductor memory element, multiple nonvolatile semiconductor memory elements, and a controller. A wiring pattern includes a signal line that is formed between the connector and the controller and that connects the connector to the controller. On the opposite side of the controller to the signal line, the multiple nonvolatile semiconductor memory elements are aligned along the longitudinal direction of the substrate.

14 Claims, 13 Drawing Sheets

Related U.S. Application Data continuation of application No. 17/077,560, filed on Oct. 22, 2020, now Pat. No. 11,244,708, which is a continuation of application No. 16/736,945, filed on Jan. 8, 2020, now Pat. No. 10,847,190, which is a continuation of application No. 16/423,665, filed on May 28, 2019, now Pat. No. 10,566,033, which is a continuation of application No. 16/044,912, filed on Jul. 25, 2018, now Pat. No. 10,339,981, which is a continuation of application No. 15/646,360, filed on Jul. 11, 2017, now Pat. No. 10,056,119, which is a continuation of application No. 15/236,037, filed on Aug. 12, 2016, now Pat. No. 9,721,621, which is a continuation of application No. 14/328,552, filed on Jul. 10, 2014, now Pat. No. 9,449,654, which is a continuation of application No. 13/954,254, filed on Jul. 30, 2013, now Pat. No. 8,817,513, which is a continuation of application No. 13/731,599, filed on Dec. 31, 2012, now Pat. No. 8,611,126, which is a continuation of application No. 13/052,425, filed on Mar. 21, 2011, now Pat. No. 8,379,427.

(51) Int. Cl.
*G06F 16/9535* (2019.01)
*G11C 5/04* (2006.01)
*G11C 5/06* (2006.01)
*G11C 14/00* (2006.01)
*G11C 16/04* (2006.01)

(52) U.S. Cl.
CPC .............. *G11C 5/06* (2013.01); *G11C 5/063* (2013.01); *G11C 14/0018* (2013.01); *G11C 16/04* (2013.01); *G06F 2213/0032* (2013.01)

(58) Field of Classification Search
USPC ...................................... 365/51, 63
See application file for complete search history.

(56) References Cited

U.S. PATENT DOCUMENTS

| | | |
|---|---|---|
| 6,646,948 B1 | 11/2003 | Stence |
| 7,234,644 B2 | 6/2007 | Nishizawa et al. |
| 7,477,522 B2 | 1/2009 | Hazelzet |
| 7,581,058 B2 | 8/2009 | Takase et al. |
| 7,826,181 B2 | 11/2010 | Tang |
| 8,198,549 B2 | 6/2012 | Saito et al. |
| 8,379,427 B2 | 2/2013 | Sugita et al. |
| 8,817,513 B2 | 8/2014 | Sugita |
| 9,449,654 B2 | 9/2016 | Sugita et al. |
| 10,056,119 B2 | 8/2018 | Sugita |
| 10,339,981 B2 | 7/2019 | Sugita |
| 10,847,190 B2 | 11/2020 | Sugita |
| 11,244,708 B2 | 2/2022 | Sugita |
| 2002/0039802 A1* | 4/2002 | Ban .................... G01R 31/2831 438/14 |
| 2004/0174728 A1 | 9/2004 | Takano |
| 2006/0157572 A1 | 7/2006 | Nishizawa |
| 2006/0170112 A1* | 8/2006 | Tanaka .................... H01L 24/05 257/777 |
| 2007/0121359 A1 | 5/2007 | Kanda |
| 2009/0061688 A1 | 3/2009 | Aoki et al. |
| 2010/0073860 A1 | 3/2010 | Moriai et al. |
| 2010/0153625 A1 | 6/2010 | Sugita et al. |
| 2011/0156026 A1 | 6/2011 | Yamazaki et al. |

FOREIGN PATENT DOCUMENTS

| | | |
|---|---|---|
| JP | 09-147545 | 6/1997 |
| JP | H09-147545 A | 6/1997 |
| JP | 11-204726 A | 7/1999 |
| JP | H11-204726 A | 7/1999 |
| JP | H11-251516 A | 9/1999 |
| JP | 2000-252418 A | 9/2000 |
| JP | 2001-143032 A | 5/2001 |
| JP | 2002-026073 A | 1/2002 |
| JP | 2004-062725 A | 2/2004 |
| JP | 2005-150490 | 6/2005 |
| JP | 2006-049411 A | 2/2006 |
| JP | 2006-173409 A | 6/2006 |
| JP | 2006-237285 A | 9/2006 |
| JP | 2006-237385 A | 9/2006 |
| JP | 3131669 U | 5/2007 |
| JP | 2007-165928 A | 6/2007 |
| JP | 2008-135597 A | 6/2008 |
| JP | 2008-198212 A | 8/2008 |
| JP | 2009-10913 | 1/2009 |
| JP | 2009-59252 A | 3/2009 |
| JP | 2008-103462 | 5/2009 |
| JP | 2009-163409 A | 7/2009 |
| JP | 2009-176922 A | 8/2009 |
| JP | 2009-289277 A | 12/2009 |
| JP | 2010-61438 | 3/2010 |
| JP | 2010-79445 | 4/2010 |
| JP | 2010-079445 A | 4/2010 |
| JP | 2010-079675 A | 4/2010 |
| JP | 2010-097686 A | 4/2010 |
| JP | 2010-152522 A | 7/2010 |
| WO | WO 2010/054478 A1 | 5/2010 |

OTHER PUBLICATIONS

"Solid State Drives", Transcend, <URL:http://www.transcend.com.jp/Products/CatList.asp?Func1No1&FidNo=21>, 2 pages (with English translation).

"Disassemble New MacBook Air—investigate a secret of thinness and competitive price", Nikkei Electronics, Nikkei Businesspublications, Inc., No. 1045, Dec. 13, 2010, pp. 83-90.

Office Action issued Jul. 2, 2013 in Japanese Patent Application No. 2011-037344 (with English language translation).

Japanese Office Action issued Dec. 2, 2014 in Patent Application No. 2013-217607 (with English translation).

Japanese Office Action dated Jun. 9, 2015 issued in Japanese Patent Application No. 2015-066717 (with English translation).

Japanese Office Action issued Sep. 8, 2015 in Patent Application No. 2015-066717 (with English translation).

\* cited by examiner

SEMICONDUCTOR DEVICE

CROSS-REFERENCE TO RELATED APPLICATIONS

This application is a continuation of and claims benefit under 35 U.S.C. § 120 to U.S. application Ser. No. 17/565,713 filed Dec. 30, 2021, which is a continuation of and claims benefit under 35 U.S.C. § 120 to U.S. application Ser. No. 17/077,560, filed Oct. 22, 2020 (now U.S. Pat. No. 11,244,708), which is a continuation of and claims benefit under 35 U.S.C. § 120 to U.S. application Ser. No. 16/736,945, filed Jan. 8, 2020 (now U.S. Pat. No. 10,847,190), which is a continuation of and claims benefit under 35 U.S.C. § 120 to U.S. application Ser. No. 16/423,665, filed May 28, 2019 (now U.S. Pat. No. 10,566,033), which is a continuation of and claims benefit under 35 U.S.C. § 120 to U.S. application Ser. No. 16/044,912, filed Jul. 25, 2018 (now U.S. Pat. No. 10,339,981), which is a continuation of and claims benefit under 35 U.S.C. § 120 to U.S. application Ser. No. 15/646,360, filed Jul. 11, 2017 (now U.S. Pat. No. 10,056,119), which is a continuation of and claims benefit under 35 U.S.C. § 120 to U.S. application Ser. No. 15/236,037, filed Aug. 12, 2016 (now U.S. Pat. No. 9,721,621), which is a continuation of and claims benefit under 35 U.S.C. § 120 to U.S. application Ser. No. 14/328,552, filed Jul. 10, 2014 (now U.S. Pat. No. 9,449,654), which is a continuation of and claims benefit under 35 U.S.C. § 120 to U.S. application Ser. No. 13/954,254, filed Jul. 30, 2013 (now U.S. Pat. No. 8,817,513), which is a continuation of and claims benefit under 35 U.S.C. § 120 to U.S. application Ser. No. 13/731,599, filed Dec. 31, 2012 (now U.S. Pat. No. 8,611,126), which is a continuation of and claims benefit under 35 U.S.C. § 120 to U.S. application Ser. No. 13/052,425, filed Mar. 21, 2011 (now U.S. Pat. No. 8,379,427), which is based upon and claims the benefit of priority under 35 U.S.C. § 119 from Japanese Patent Application No. 2011-37344, filed Feb. 23, 2011, the entire contents of each of which are incorporated herein by reference.

FIELD

Embodiments disclosed herein relate generally to a semiconductor device.

BACKGROUND

Semiconductor devices generally have been used which have a nonvolatile semiconductor memory element such as a NAND flash memory mounted on a substrate with a connector formed therein. Also, the semiconductor devices further include a volatile semiconductor memory element and a controller for controlling the nonvolatile semiconductor memory element and the nonvolatile semiconductor memory element besides the nonvolatile semiconductor memory element.

In these semiconductor devices, the shape and size of the substrate can be restricted according to the use environment thereof, specifications, etc. Therefore, it is required to dispose the nonvolatile semiconductor memory element and so on according to the shape and size of the substrate and to suppress deterioration of the performance characteristic of the semiconductor devices.

DETAILED DESCRIPTION

In general, according to an embodiment, a semiconductor device includes a substrate, a connector, a volatile semiconductor memory element, nonvolatile semiconductor memory elements, and a controller. The substrate is a multi-layered structure with a wiring pattern formed therein, and has an almost rectangular shape in a plan view. The connector is provided on a short side of the surface to be connectable to a host device. The volatile semiconductor memory element is provided on the front surface layer side of the substrate. The nonvolatile semiconductor memory elements are provided on the front surface layer side of the substrate. The controller is provided on the front surface layer side of the substrate to control the volatile semiconductor memory element and the nonvolatile semiconductor memory element. The wiring pattern includes signal lines formed between the connector and the controller to connect the connector and the controller to each other. On the opposite side of the controller to the signal lines, multiple nonvolatile semiconductor memory elements are aligned along the longitudinal direction of the substrate.

Exemplary embodiments of semiconductor devices will be explained below in detail with reference to the accompanying drawings. The present invention is not limited to the following embodiments.

Figure 1:
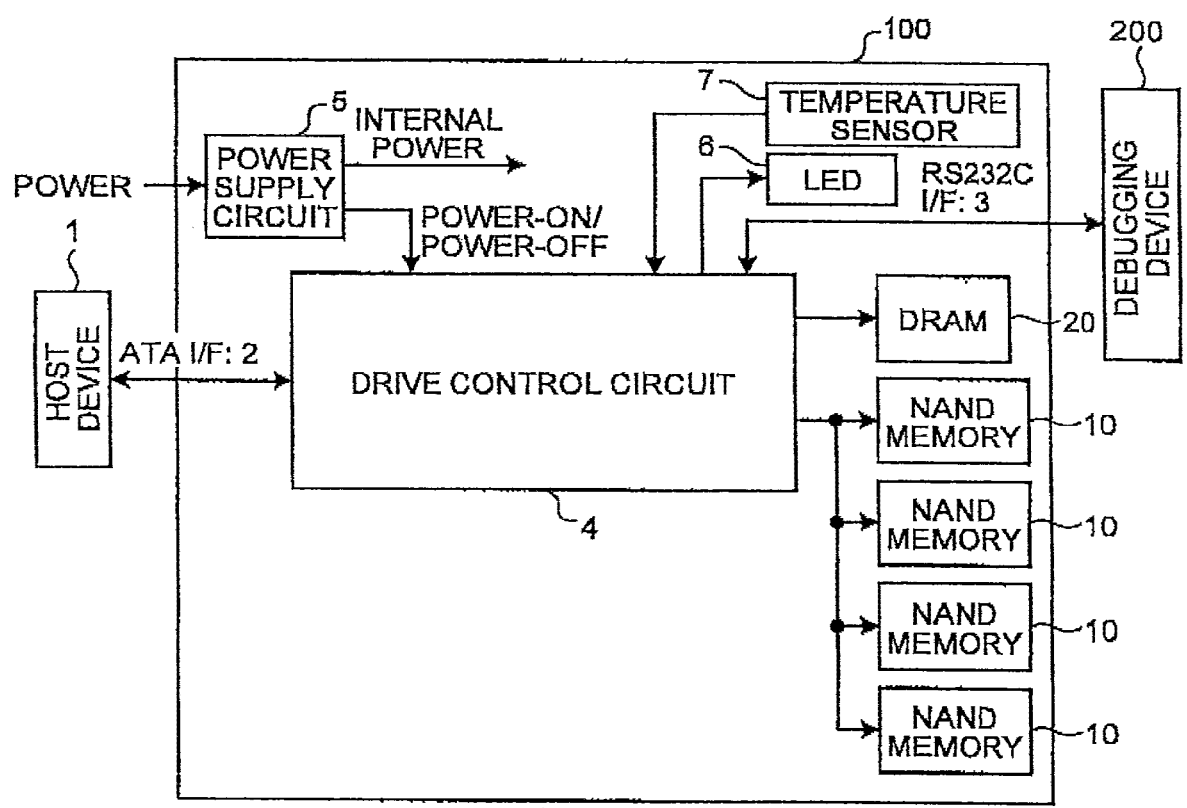
FIG. 1 is a block diagram illustrating an example of a configuration of a semiconductor device according to a first embodiment.

FIG. 1 is a block diagram illustrating an exemplary configuration of a semiconductor device according to a first embodiment. A semiconductor device 100 is connected to a host device (hereinafter, abbreviated as a host) 1 such as a personal computer or a CPU through a memory connection interface such as a SATA interface (ATA I/F) 2, and functions as an external memory of the host 1. Examples of the host 1 include a CPU of a personal computer, a CPU of an imaging device such as a still camera and a video camera. Further, the semiconductor device 100 can perform data communication with a debugging device 200 through a communication interface 3 such as RS232C interface (RS232C I/F).

The semiconductor device 100 includes NAND-type flash memories (hereinafter, abbreviated as NAND memories) 10 serving as the nonvolatile semiconductor memory elements, a drive control circuit 4 serving as the controller, a DRAM 20 which is a volatile semiconductor memory element capable of a higher-speed memory operation than the NAND memories 10, a power supply circuit 5, an LED 6 for status display, and a temperature sensor 7 for detecting an internal temperature of a drive. The temperature sensor 7 directly or indirectly measures, for example, the temperature of the NAND memories 10. In a case where a result measured by the temperature sensor 7 reaches or exceeds a predetermined temperature, the drive control circuit 4 restricts information writing and the like on the NAND memories 10 so as to suppress the temperature from rising any further. Incidentally a non volatile semiconductor memory element, such as MRAM (Magneto resistive Random Access Memory) for example, may be used instead of the DRAM 20.

The power supply circuit 5 generates multiple different internal DC power voltages from an external DC power supplied from a power supply circuit on the host 1 side, and supplies the internal DC power voltages to individual circuits in the semiconductor device 100. Further, the power supply circuit 5 senses the rise of the external power, generates a power-on/reset signal, and provides the power-on/reset signal to the drive control circuit 4.

Figure 2:
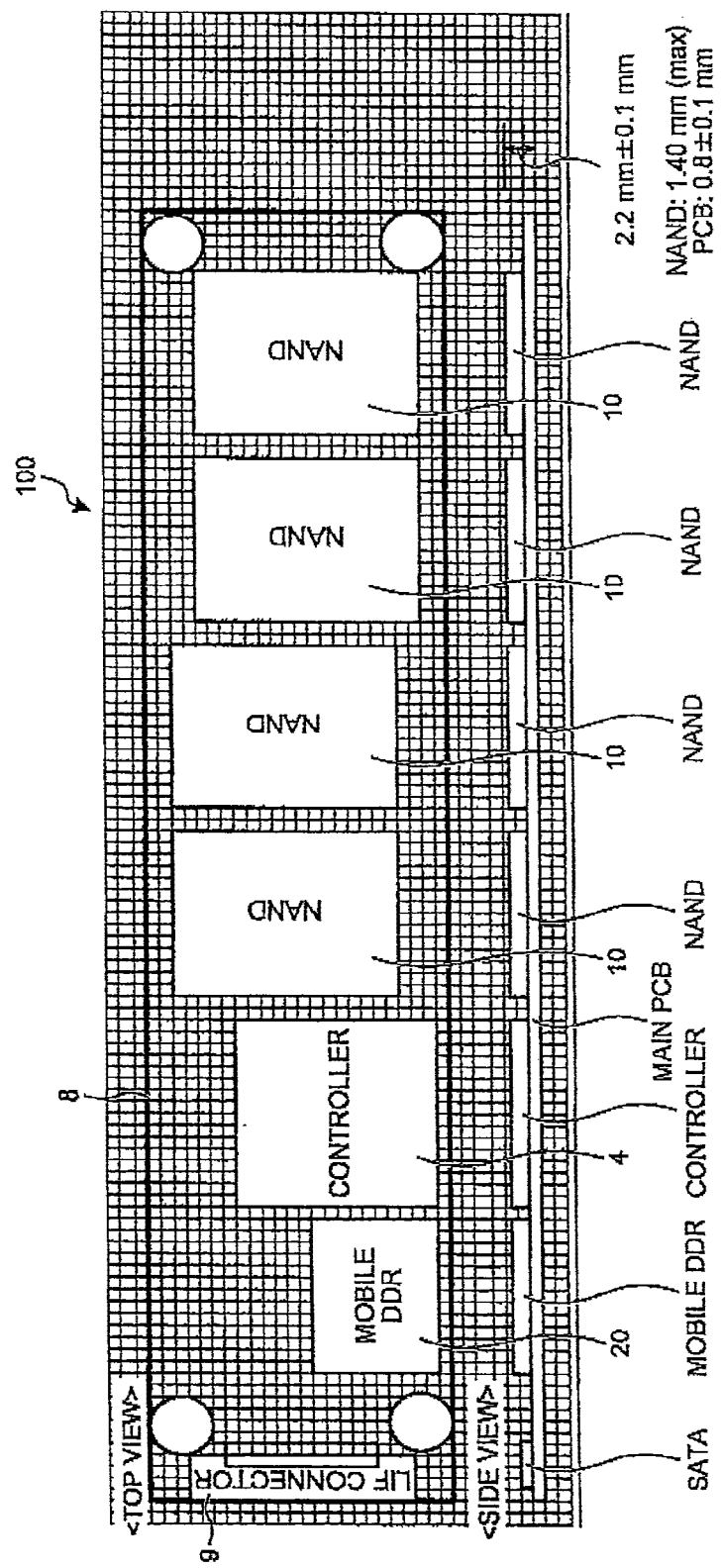
FIG. 2 is a plan view illustrating a schematic configuration of the semiconductor device.
Figure 3:
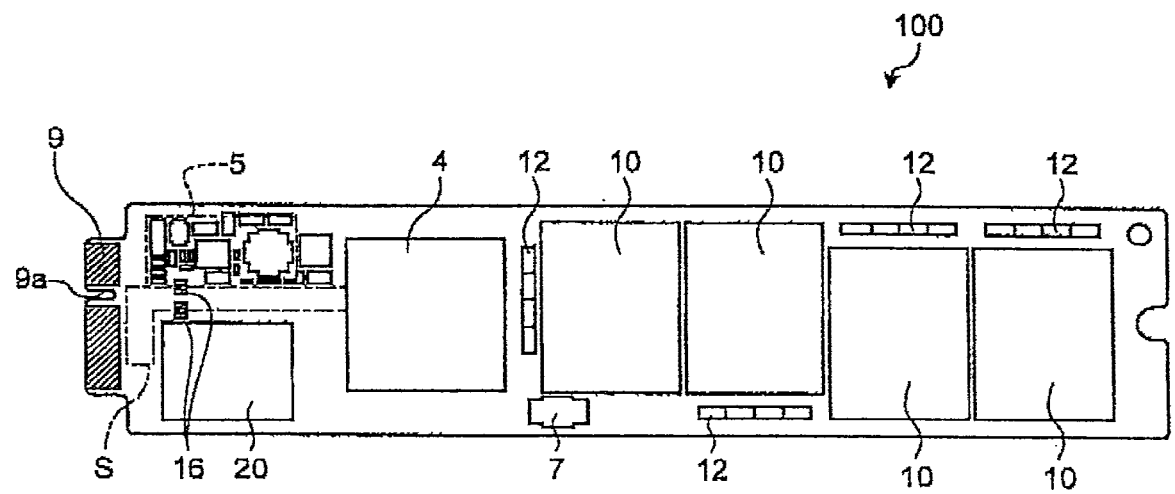
FIG. 3 is a plan view illustrating a detailed configuration of the semiconductor device.

FIG. 2 is a plan view illustrating the schematic configuration of the semiconductor device 100. FIG. 3 is a plan view illustrating the detailed configuration of the semiconductor device 100. The power supply circuit 5, the DRAM 20, the drive control circuit 4, and the NAND memories 10 are mounted on the substrate 8 with the wiring pattern formed therein. The substrate 8 has an almost rectangular shape in a plan view. On one short side of the substrate 8 having an almost rectangular shape, a connector 9 is provided to be connected to the host 1. The connector 9 functions as the above-mentioned SATA interface 2 and the communication interface 3. The connector 9 also functions as a power input unit supplying the power input from the host 1 to the power supply circuit 5. The connector 9 is, for example, a LIF connector. Further, the connector 9 has a slit 9a formed at a position deviating from the center of the substrate 8 in the widthwise direction of the substrate 8 such that, for example, a protrusion (not illustrated) provided on the host 1 side fits in the slit 9a. Therefore, it is possible to prevent the semiconductor device 100 from being installed upside down.

The substrate 8 is a multi-layered structure formed by stacking synthetic resins, for example, it is an 8-layer structure. However, the number of layers of the substrate 8 is not limited to 8. In the substrate 8, the wiring pattern is formed in various shapes on the surface or in the inside of each layer made of a synthetic resin. The wiring pattern formed in the substrate 8 electrically connects the power supply circuit 5, the DRAM 20, the drive control circuit 4, and the NAND memories 10 mounted on the substrate 8, to one another.

Next, the layout of the power supply circuit 5, the DRAM 20, the drive control circuit 4, and the NAND memories 10 relative to the substrate 8 will be described. As illustrated in FIG. 2 and FIG. 3, the power supply circuit 5 and the DRAM 20 are disposed near the connector 9. Further, next to the power supply circuit 5 and the DRAM 20, the drive control circuit 4 is disposed. Furthermore, next to the drive control circuit 4, the NAND memories 10 are disposed. That is, along the longitudinal direction of the substrate 8 from the connector 9 side, the DRAM 20, the drive control circuit 4, and the NAND memories 10 are disposed in this order.

The multiple NAND memories 10 are mounted on the substrate 8, and the multiple NAND memories 10 are disposed side by side along the longitudinal direction of the substrate 8. In the first embodiment, four NAND memories 10 are disposed. However, as long as the number of NAND memories 10 is plural, the number of mounted NAND memories 10 is not limited thereto.

Further, among the four NAND memories 10, two NAND memories 10 may be disposed on one long side of the substrate 8, and the other two NAND memories 10 may be disposed on the other long side of the substrate 8.

Figure 4:
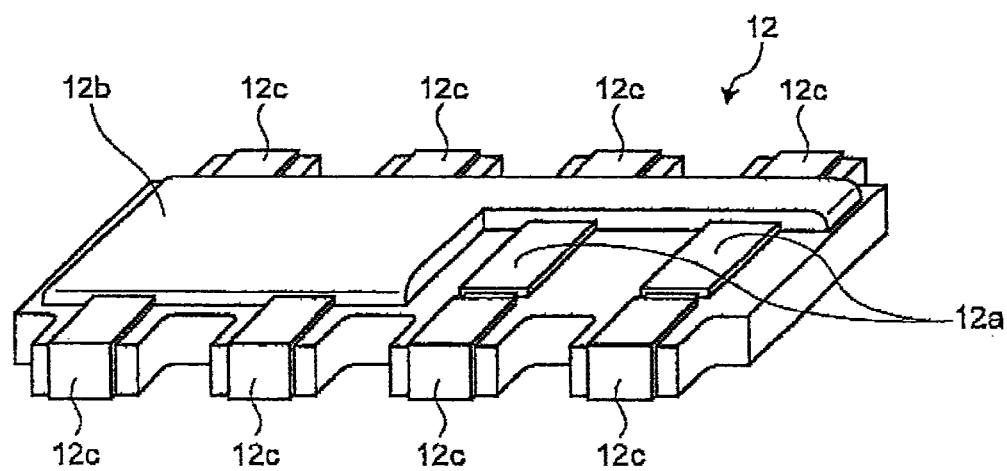
FIG. 4 is a perspective view illustrating a schematic configuration of a resistive element.

Also, on the substrate 8, resistive elements 12 are mounted. The resistive elements 12 are provided in the middle of the wiring pattern (wiring lines) connecting the drive control circuit 4 to the NAND memories 10 and thus functions as resistors against signals input to and output from the NAND memories 10. FIG. 4 is a perspective view illustrating the schematic configuration of the resistive element 12. As illustrated in FIG. 4, the resistive element 12 is formed in such a form in which multiple resistive films 12 provided between electrodes 12c are collectively covered with a protective coat 12b. Each NAND memory 10 is provided with one resistive element 12. Further, each resistive element 12 is disposed near the corresponding NAND memory 10 connected to the resistive element 12.

Next, the wiring pattern formed in the substrate 8 will be described. As illustrated in FIG. 3, between the power supply circuit 5 and the drive control circuit 4, there is a region S where nearly no electronic components and the like are mounted. In the region S of the substrate 8, signal lines (SATA signal lines) to connect the connector 9 to the drive control circuit 4 is formed as a portion of the wiring pattern. As described above, on the substrate 8, on the connector 9 side relative to the drive control circuit 4, the SATA signal lines 14 are formed, and on the opposite side of the drive control circuit 4 to the connector 9, the NAND memories 10 are disposed side by side in a line along the longitudinal direction of the substrate 8.

Figure 5:
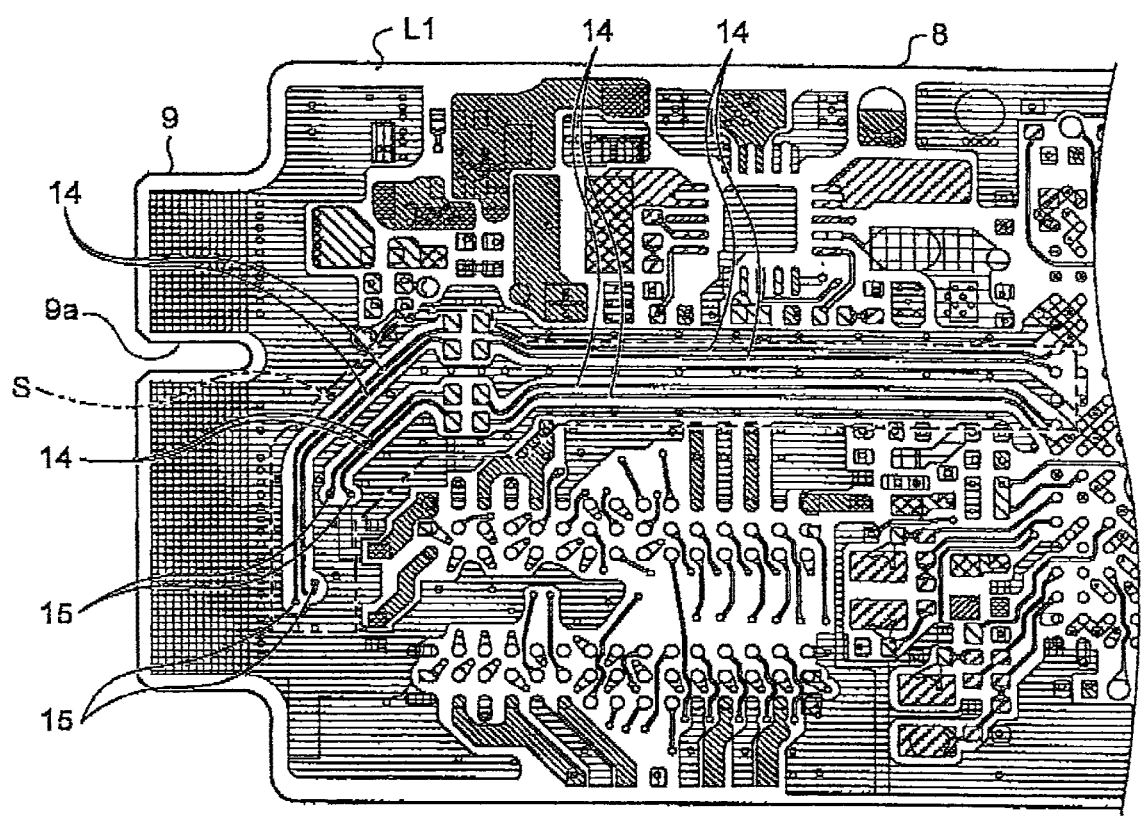
FIG. 5 is a view illustrating a circuit configuration in a front surface layer (first layer) of the substrate.
Figure 6:
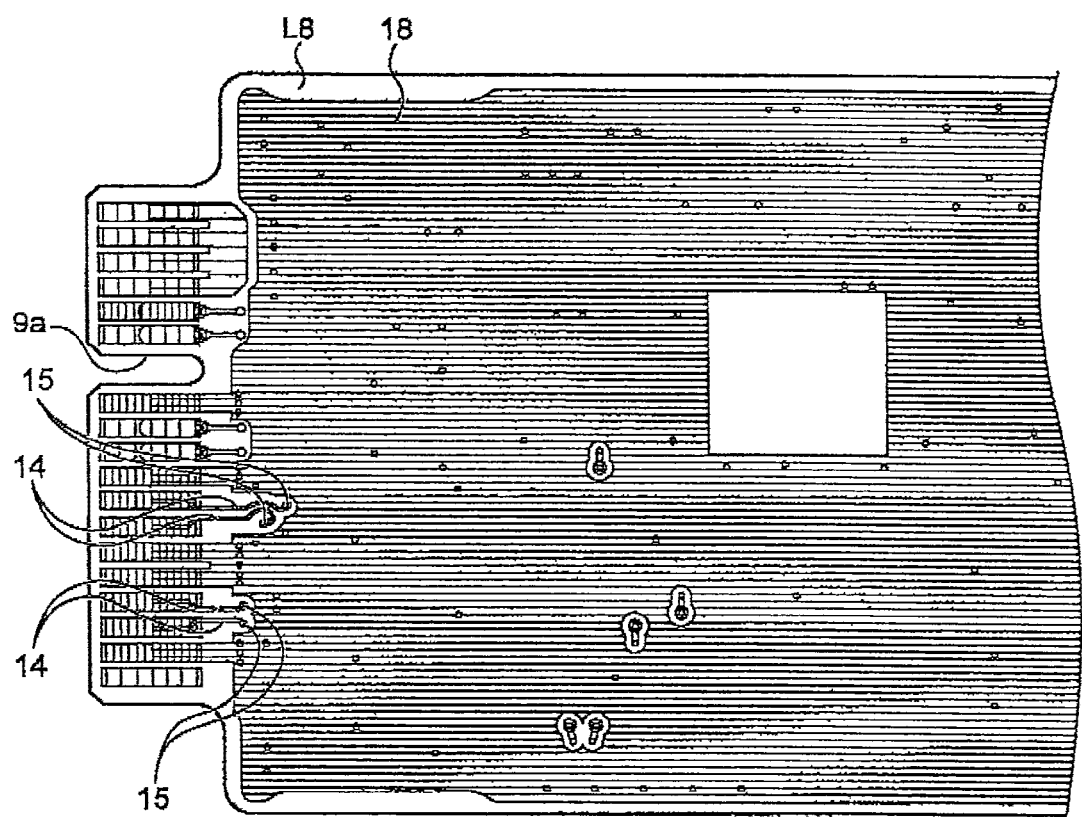
FIG. 6 is a view illustrating a circuit configuration in a rear surface layer (eighth layer) of the substrate.

FIG. 5 is a view illustrating the circuitry configuration on a front surface layer (first layer) L1 of the substrate 8. FIG. 6 is a view illustrating the circuitry configuration on a rear surface layer (eighth layer) L8 of the substrate 8. In the region S of the front surface layer L1 of the substrate 8, the SATA signal lines 14 are formed along the way from the position where the drive control circuit 4 is disposed near the connector 9. Further, the SATA signal lines further extend from there through the via-holes 15, which are formed to pass through the substrate 8 in the vicinity of the connector 9. Then the SATA signal lines are connected to SATA signal lines 14 formed on the rear surface layer L8 of the substrate 8, thereby finally reaching the connector 9. When it is necessary to provide an electrode for the connector on the rear surface layer side of the substrate 8, it is required to form the SATA signal lines 14 to extend through the substrate 8 up to the rear surface layer L8 as described above.

The most region of the rear surface layer L8 of the substrate 8, except for the region provided with the SATA signal lines 14, is a ground 18. Further, although not illustrated, in inside layers between the front surface layer L1 and the rear surface layer L8 of the substrate 8, in portions overlapping the SATA signal lines 14, nearly no wiring patterns other than SATA signal lines 14 are formed. That is, in the portion overlapping the region S in the substrate 8, no wiring patterns other than the SATA signal lines 14 are formed.

Further, the SATA signal lines 14 are partially broken on the front surface layer L1, but this is not especially problematic because signals running through the SATA signal lines 14 are relayed by relay terminals 16 (see FIG. 3) mounted on the corresponding portions on the substrate 8. Furthermore, the front surface of the substrate 8 is covered with a protective coat (not illustrated) with an insulating property, such that the wiring pattern formed on the front surface layer L1 is surely insulated.

Figure 7:
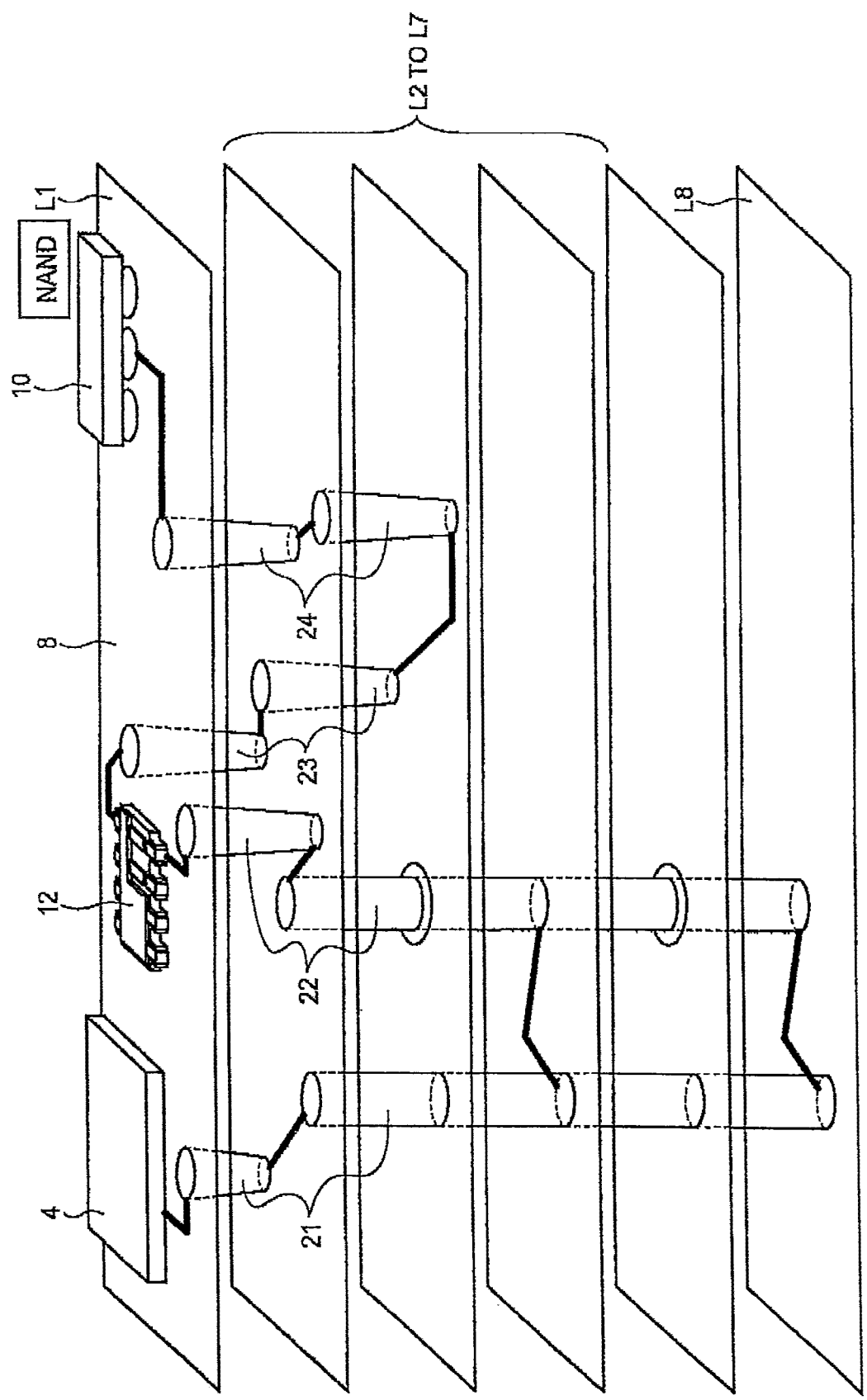
FIG. 7 is a view illustrating a configuration of wiring lines connecting a drive control circuit to NAND memories, and is a conceptual view of a layer structure of the substrate.

FIG. 7 is a view illustrating the configuration of wiring lines connecting the drive control circuit 4 to the NAND memories 10, and is the conceptual view of a layer structure of the substrate 8. In FIG. 7, in order to simplify the drawing, a portion of the layer structure of the substrate 8 is not illustrated.

As illustrated in FIG. 7, the wiring line to connect the drive control circuit 4 to the resistive element 12 is connected to the drive control circuit 4 on the front surface layer of the substrate 8 and extends up to the inside layers of the substrate 8 through via-holes 21. The wiring line runs around the inside layers, then extends further to the front surface layer through via-holes 22 again, and is connected to the resistive element 12.

Further, the wiring line to connect the resistive element 12 to the NAND memory 10 is connected to the resistive element 12 on the front surface layer of the substrate 8, and then extends up to the inside layers of the substrate 8 through via-holes 23. The wiring line runs around the inside layers of the substrate 8, then extends further up to the front surface layer of the substrate 8 through via-holes 24, and is connected to the NAND memory 10.

As described above, since the resistive element 12 is disposed near the NAND memory 10, the wiring line connecting the resistive element 12 to the NAND memory 10 is shorter than the wiring line connecting the drive control circuit 4 to the resistive element 12.

Here, since the semiconductor device 100 includes the multiple NAND memories, multiple wiring lines are formed in the substrate 8 to connect the resistive elements 12 to the NAND memories 10. Since the resistive elements 12 are disposed near the corresponding NAND memories 10, a variation in length of multiple wiring lines connecting the resistive elements 12 to the NAND memories 10 is suppressed.

The power supply circuit 5, the drive control circuit 4, the DRAM 20, the NAND memories 10, and the SATA signal lines 14 are disposed as described above, whereby it is possible to appropriately dispose those elements on the substrate 8 having an almost rectangular shape in a plan view.

Further, the power supply circuit 5 is disposed near the connector 9, bypassing the SATA signal lines 14. This makes it difficult for noise generated from the power supply circuit 5 to influence other elements or the SATA signal lines 14, and improves the stability of the operation of the semiconductor device 100.

Furthermore, the DRAM 20 is disposed to bypass the SATA signal lines 14. This makes it difficult for noise generated from the DRAM 20 to influence other elements or the SATA signal lines 14, and improves the stability of the operation of the semiconductor device 100.

In general, it is preferable to dispose the DRAM 20 near the drive control circuit 4. In the first embodiment, since the DRAM 20 is disposed near the drive control circuit 4, it is possible to suppress deterioration of the performance characteristic of the semiconductor device 100.

Also, among the four NAND memories 10, two NAND memories 10 are disposed on one long side of the substrate 8, and the other two NAND memories 10 are disposed on the other long side of the substrate 8. This configuration makes it possible to suppress the wiring pattern from being one-sided in the substrate 8 and to form the wiring pattern in balance.

Further, since the resistive elements 12 are disposed near the corresponding NAND memories 10, a variation in length of the multiple wiring lines connecting the resistive elements 12 to the NAND memories 10 is suppressed and thus it is possible to suppress deterioration of the performance characteristic of the semiconductor device 100.

Furthermore, since the most region of the rear surface layer L8 of the substrate 8, except for the region provided with the SATA signal lines 14, is a ground 18, in a case where a device of the host 1 exists on the rear surface layer side of the semiconductor device 100 in a state in which the semiconductor device 100 is inserted into the host 1, it is possible to suppress noise from the device from influencing each element, such as the wiring pattern and the NAND memories 10, of the semiconductor device 100. Similarly, it is difficult that noise from the wiring line and each element of the semiconductor device 100 influences the device on the host 1 side.

As in the embodiment, in a case where it is necessary to provide an electrode for a connector 9 on the rear surface layer side of the substrate 8, it is possible to shorten the SATA signal lines 14 formed on the rear surface layer L8 by passing the SATA signal lines 14 through the substrate 8 to the rear surface layer L8 at the position near the connector 9. Therefore, in a case where a device on the host 1 exists on the rear surface layer side of the semiconductor device 100, it is difficult for noise from the device to influence the SATA signal lines 14.

Also, in a portion overlapping the region S in the substrate 8, the wiring pattern except for the SATA signal lines 14 is rarely formed. Therefore, it is possible to easily manage impedance relative to the SATA signal lines 14.

Further, in the embodiment, the substrate 8 having the eight-layer structure is given as an example. However, the present invention is not limited thereto. The number of layers of the substrate 8 may be changed.

Figure 8:
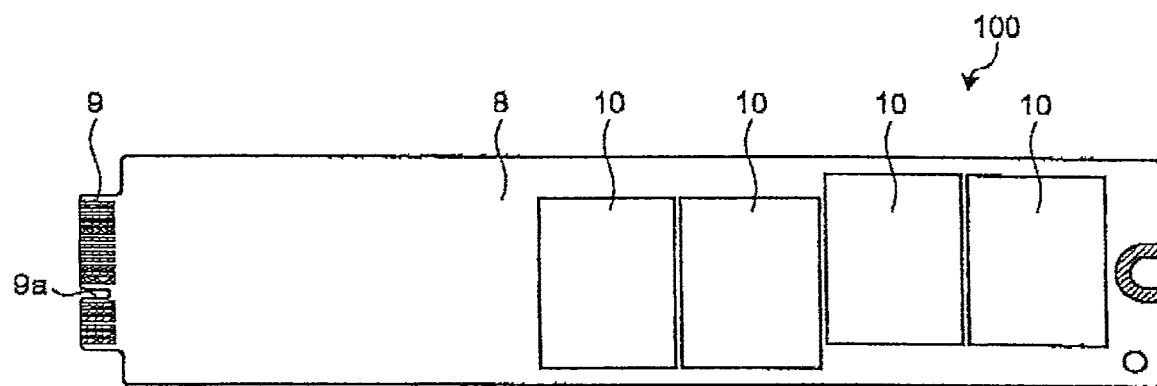
FIG. 8 is a bottom view illustrating a schematic configuration of a semiconductor device according to a first modification of the first embodiment.
Figure 9:
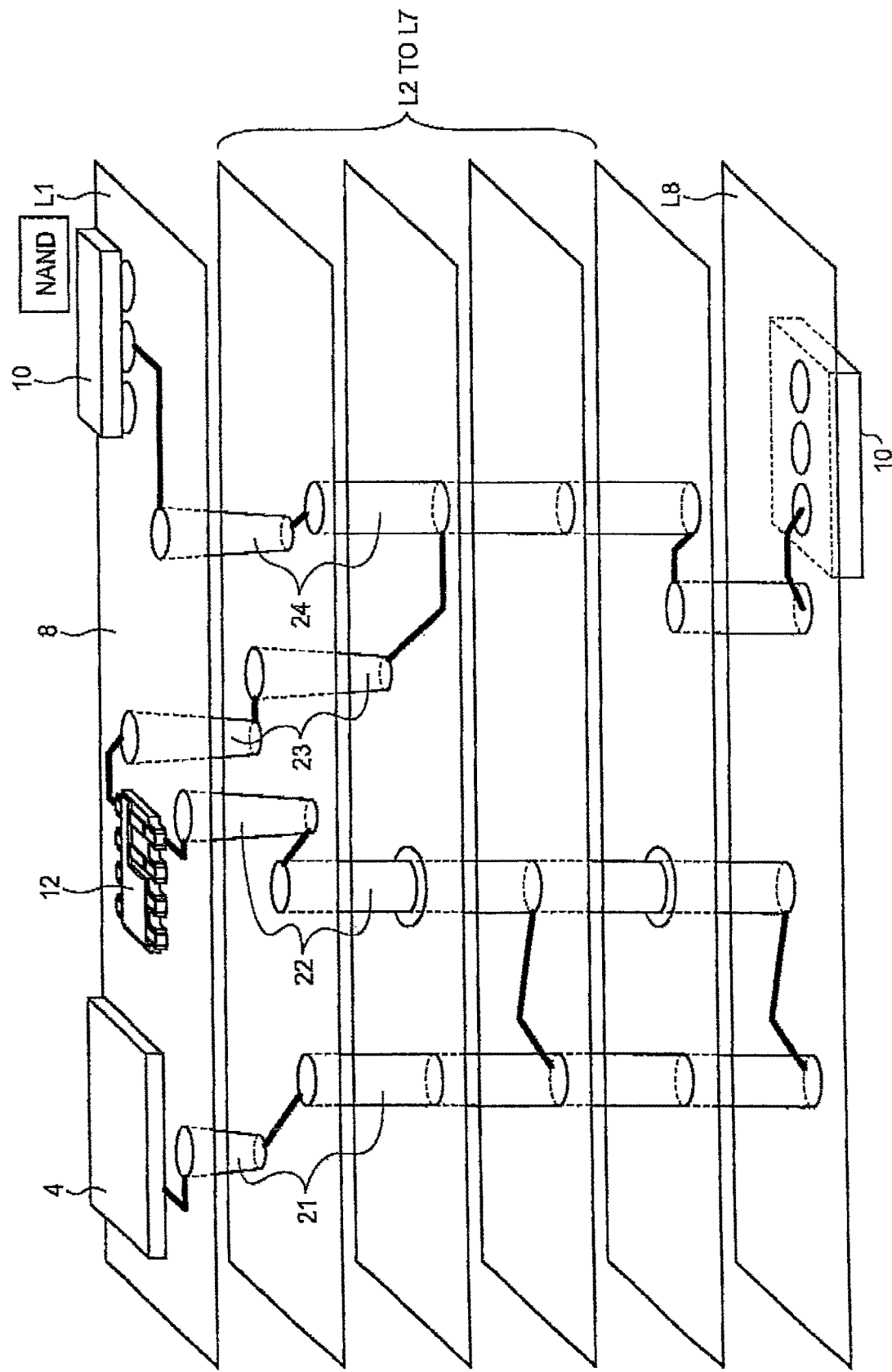
FIG. 9 is a view illustrating a configuration of wiring lines connecting a drive control circuit to NAND memories, and is a conceptual view of a layer structure of the substrate.

FIG. 8 is a bottom view illustrating the schematic configuration of a semiconductor device 100 according to a first modification of the first embodiment. FIG. 9 is a view illustrating the configuration of wiring lines connecting a drive control circuit 4 to NAND memories 10, and is a conceptual view of a layer structure of the substrate 8. In FIG. 9, in order to simplify the drawing, a portion of the layer structure of the substrate 8 is not illustrated.

In this first modification, even on the rear surface layer side of the substrate 8, NAND memories 10 are mounted, such that the semiconductor device 100 includes eight NAND memories 10. The NAND memories 10 mounted on the rear surface layer side of the substrate 8 are disposed to be symmetrical to the NAND memories 10 mounted on the front surface layer side of the substrate 8.

The resistive elements 12 are not mounted on the rear surface layer side of the substrate 8 but only on the front surface layer. Therefore, wiring lines to connect the resistive elements 12 to the NAND memories 10 are formed to run around the inside layers of the substrate 8, are divided by the via-holes 24, and are present not only on the front surface layer L1 of the substrate 8 but also on the rear surface layer L8. The wiring lines on the front surface layer L1 are connected to the NAND memories 10 mounted on the front surface layer side, and the wiring lines on the rear surface layer L8 are connected to the NAND memories 10 mounted on the rear surface layer side. That is, two NAND memories 10 are connected to one resistive element 12.

As described above, the NAND memories 10 are mounted on the both surfaces of the substrate 8, increasing the memory capacity of the semiconductor device 100. Further, it is possible to connect multiple (two in the modification) NAND memories 10 to each resistive element 12 by dividing the wiring line in the middle of it, and thus the semiconductor device 100 can include NAND memories 10 which are more than, in number, channels which the drive control circuit 4 has. In this modification, the drive control circuit 4 has four channels. In this case, eight NAND memories 10 can be incorporated. Further, each of two NAND memories 10 connected to one wiring line determines which of them operates, on the basis of whether a channel enable (CE) signal of the corresponding NAND memory is active or not.

Figure 10:
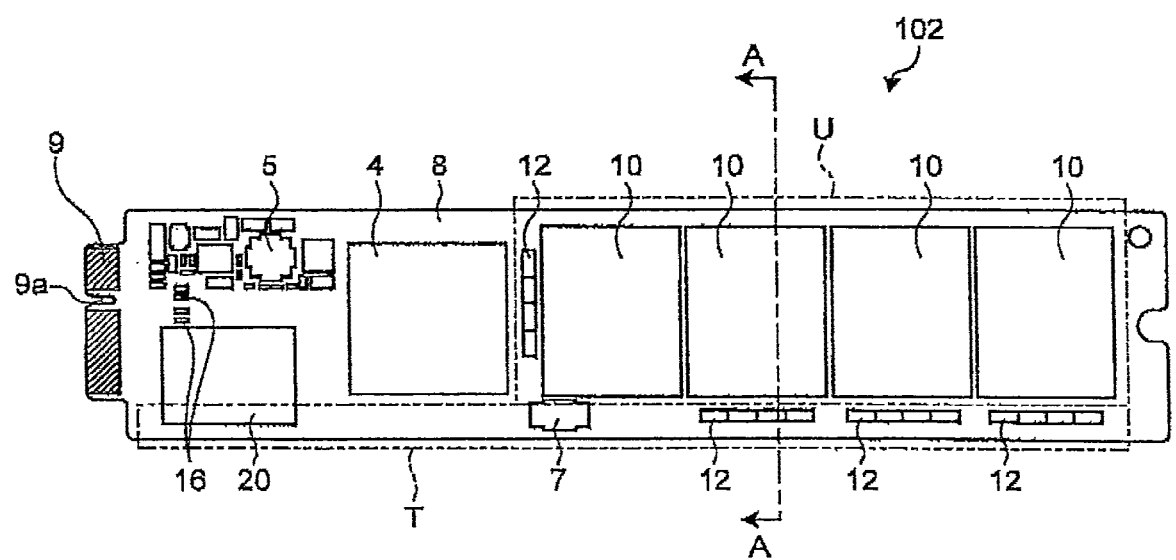
FIG. 10 is a plan view illustrating a detailed configuration of a semiconductor device according to a second embodiment.
Figure 11:
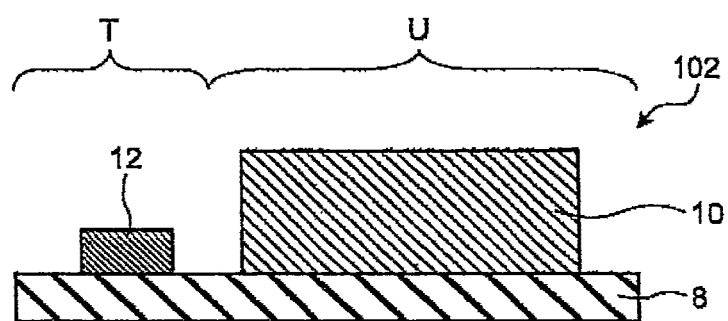
FIG. 11 is a cross-sectional view taken along line A-A of FIG. 10 in the direction of an arrow.

FIG. 10 is a plan view illustrating a detailed configuration of a semiconductor device according to a second embodiment. FIG. 11 is a cross-sectional view taken along line A-A of FIG. 10 in the direction of an arrow. The same components as in the above-mentioned embodiment are denoted by same reference symbols and the detailed description thereof is not repeated.

In the second embodiment, a semiconductor device 102 has four NAND memories 10 all of which are disposed side by side on one long side of a substrate 8, more specifically, on a long side where a power supply circuit 5 is provided. Since all of the NAND memories 10 are collectively disposed on one long side, in an empty space on the other long side, resistive elements 12 may be collectively disposed.

In general, it is often the case that the NAND memories 10 are configured to be higher than the other elements mounted on the substrate 8. For this reason, of a region T along the other long side of the substrate 8, in a portion where the resistive elements 12 are collectively disposed, as illustrated in FIG. 11, it is possible to suppress the height of the semiconductor device 102 to be lower than a region U where the NAND memories 10 are disposed.

Therefore, in a case where a partial region of the semiconductor device 102 should be lower than the other region according to a demand such as the specifications, etc., the NAND memories 10 may be disposed to bypass the corresponding region, thereby obtaining the semiconductor device 102 satisfying the demand. In the embodiment, the case where the region along the other long side of the substrate 8 should be lower than the other region is given an example. Further, a DRAM 20 and a temperature sensor 7 are also disposed in the region T. However, since it is often that the DRAM 20 and the temperature sensor 7 are configured to be lower than the NAND memories 10, it is possible to suppress the height of the semiconductor device 102 in the entire region T to be lower than the region U.

Figure 12:
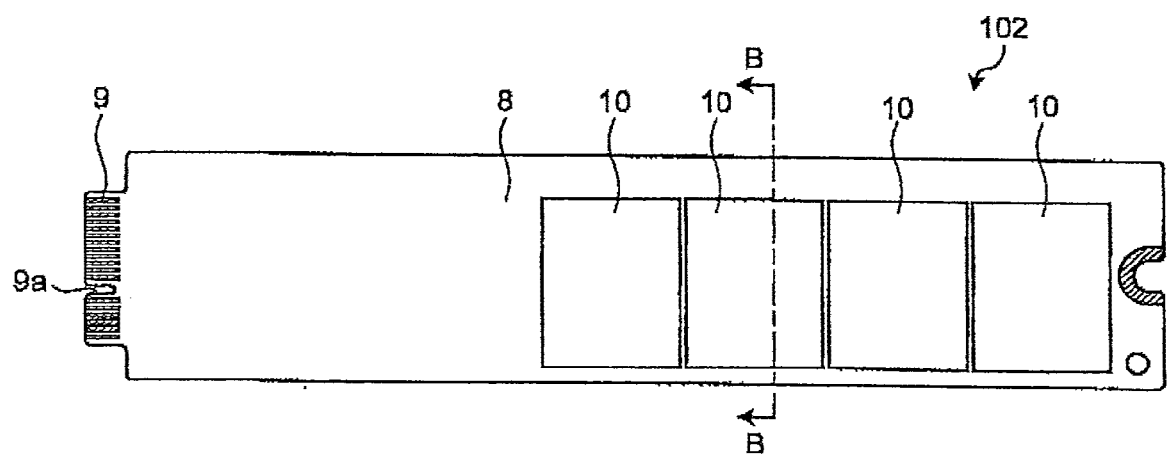
FIG. 12 is a bottom view illustrating a schematic configuration of a semiconductor device according to a first modification of the second embodiment.
Figure 13:
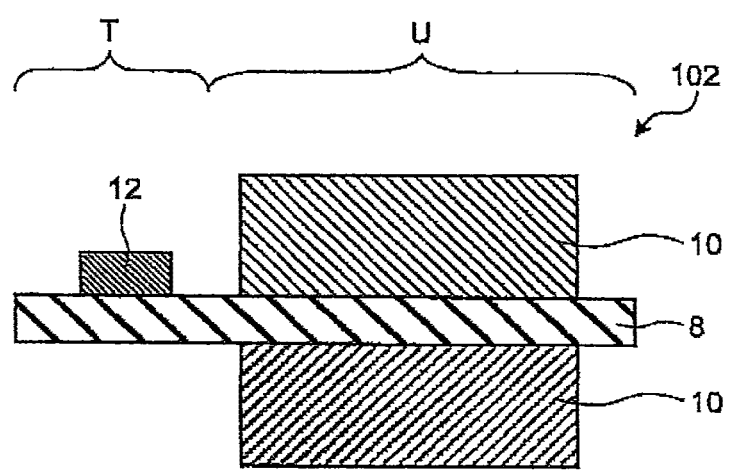
FIG. 13 is a cross-sectional view taken along line B-B of FIG. 12 in the direction of an arrow.

FIG. 12 is a bottom view illustrating a schematic configuration of a semiconductor device 102 according to a first modification of the second embodiment. In the first modification, similarly to the first modification of the first embodiment, NAND memories 10 are disposed on the rear surface layer side of the substrate 8 to be symmetric to the NAND memories 10 disposed on the front surface layer side. Therefore, it is possible to increase the memory capability of the semiconductor device 102.

Further, since the NAND memories 10 are disposed to be symmetric to the NAND memories 10 disposed on the front surface layer side of the substrate 8, even on the rear surface layer side of the substrate 8, the NAND memories 10 are disposed on one long side. Therefore, it is possible to suppress the height of the semiconductor device 102 in the region T to be low.

Furthermore, a configuration in which the resistive elements 12 are disposed only on the front surface layer side of the substrate 8 and two NAND memories 10 are connected to one resistive element 12, and an effect thereof are the same as those described in the first modification of the first embodiment.

Figure 14:
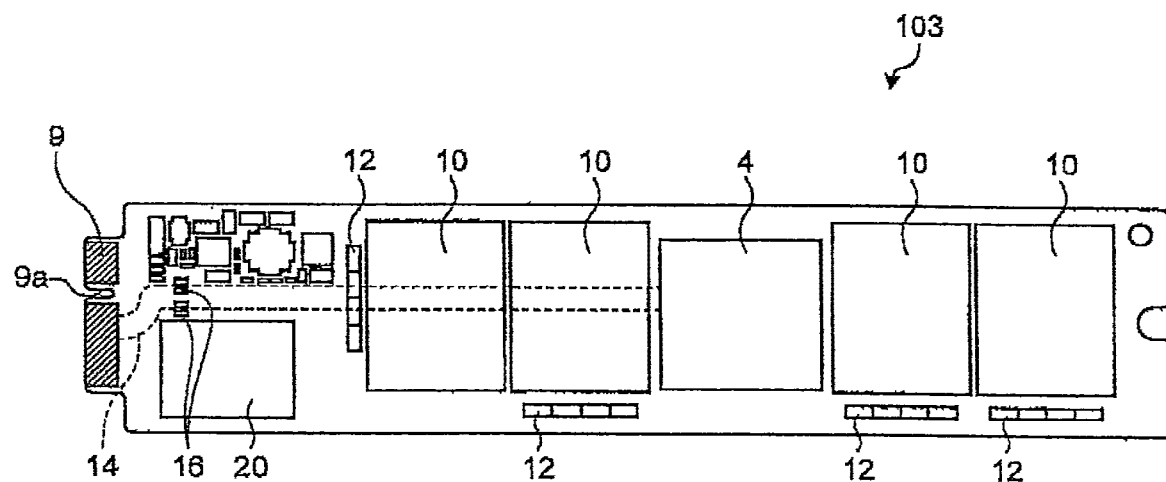
FIG. 14 is a plan view illustrating a schematic configuration of a semiconductor device according to a third embodiment.

FIG. 14 is a plan view illustrating a schematic configuration of a semiconductor device according to a third embodiment. The same components as the above-mentioned embodiments are denoted by identical reference symbols and a detailed description thereof is omitted. In the embodiment, on a connector 9 side relative to a drive control circuit 4, two NAND memories 10 are disposed, and on the opposite side, two NAND memories 10 are further disposed. That is, along the longitudinal direction of the substrate 8, multiple NAND memories 10 are disposed with the drive control circuit 4 interposed therebetween.

The NAND memories 10 are separately disposed as described above, and thus it is possible to suppress a deviation in length among wiring lines connecting the NAND memories 10 and the drive control circuit 4, as compared to a case where four NAND memories 10 are disposed side by side on one side of the drive control circuit 4. For example, in the embodiment, it is possible to suppress the ratio of the shortest wiring line to the longest wiring line among the wiring lines connecting the NAND memories 10 to the drive control circuit 4 to about 1:2. Meanwhile, similarly, in a case where four NAND memories 10 are disposed side by side on one side of the drive control circuit 4, the ratio of the shortest wiring line to the longest wiring line is about 1:4.

As described above, in the embodiment, the deviation in length among the wiring lines is suppressed, and thus it is possible to reduce a difference in optimal driver setting for the NAND memories 10. Therefore, it is possible to suppress error generation of data and to stabilize the operation of the semiconductor device 103.

The NAND memories 10 provided on the connector 9 side relative to the drive control circuit 4 are mounted on SATA signal lines 14. In the embodiment, since ball grid array (BGA) type NAND memories are used as the NAND memories 10, in a case of forming the SATA signal lines 14 on the front surface layer L1, it is necessary to bypass ball-shaped electrodes (bumps) formed on the NAND memories 10.

Figure 15:
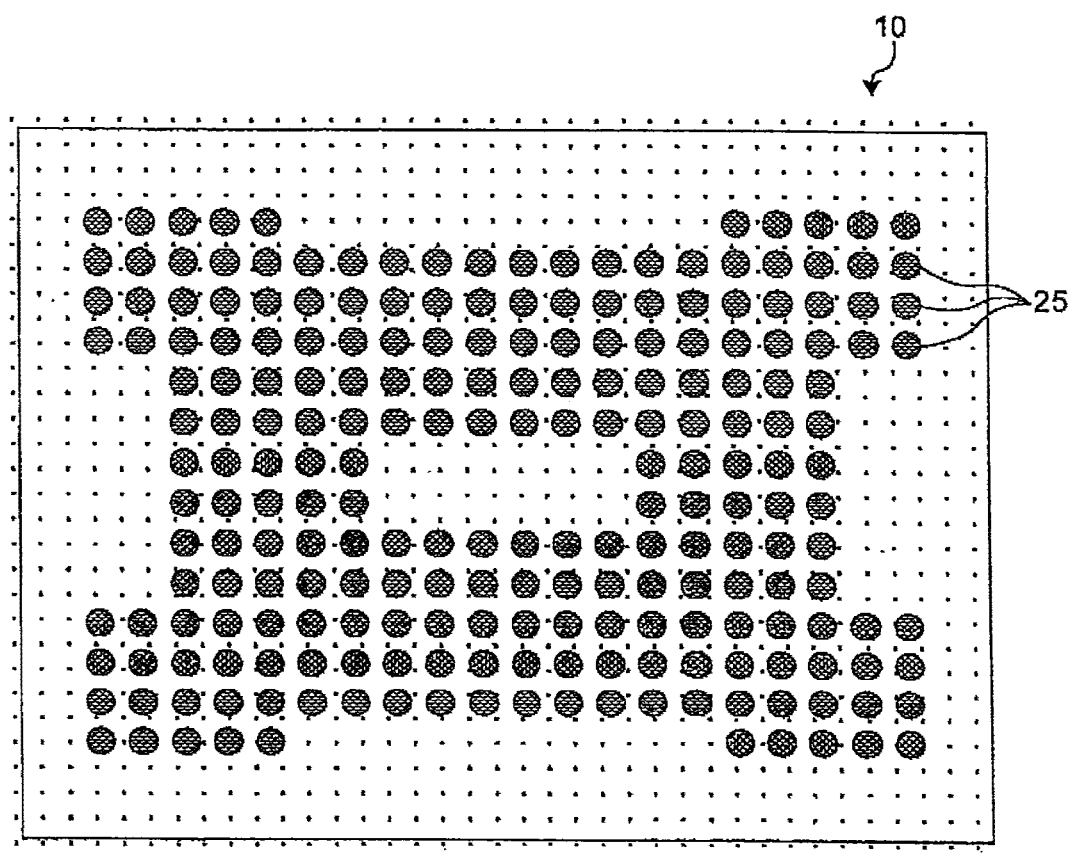
FIG. 15 is a view illustrating a bottom surface of a NAND memory.

However, as illustrated in FIG. 15, since a lot of ball-shaped electrodes 25 are provided on the bottom surfaces of the NAND memories 10, it is difficult to form the SATA signal lines 14 to bypass the ball-shaped electrodes 25. For this reason, in the invention, the SATA signal lines 14 to connect the connector 9 and the drive control circuit 4 are formed in the inside layers of the substrate 8.

Also, since the NAND memories 10 are disposed on one long side of the substrate 8, it is possible to suppress the height of the semiconductor device 103 in a region along the other long side. Further, the resistive elements 12 are disposed in the vicinities of the NAND memories 10 and thus it is possible to suppress deterioration of the performance characteristic of the semiconductor device 103. Furthermore, the number of the NAND memories 10 which the semiconductor device 103 has is not limited to four, but may be two or more.

Figure 16:
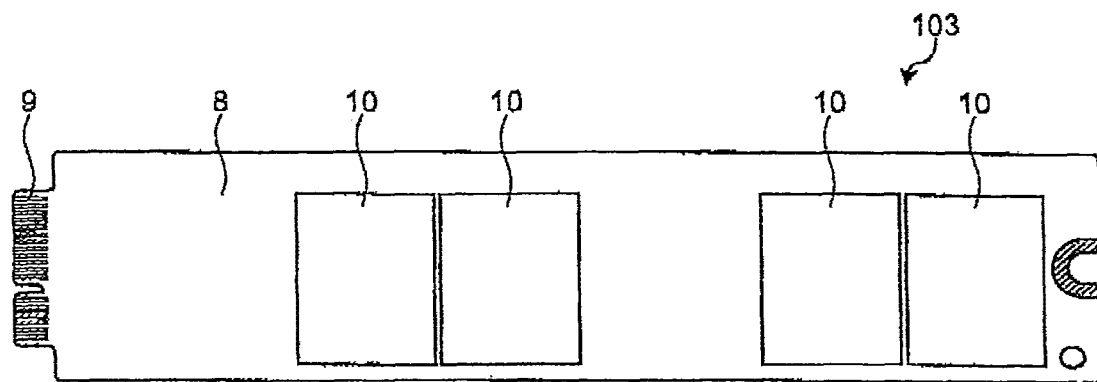
FIG. 16 is a bottom view illustrating a schematic configuration of a semiconductor device according to a first modification of the third embodiment.

FIG. 16 is a bottom view illustrating a schematic configuration of a semiconductor device according to a first modification of the third embodiment. In the first modification, similarly to the first modification of the first embodiment, NAND memories 10 are disposed on the rear surface layer side of the substrate 8 to be symmetric to the NAND memories 10 disposed on the front surface layer side. Therefore, it is possible to increase the memory capability of the semiconductor device 103.

Further, since the NAND memories 10 are disposed to be symmetric to the NAND memories 10 disposed on the front surface layer side of the substrate 8, even on the rear surface layer side of the substrate 8, the NAND memories 10 are disposed on one long side. Therefore, it is possible to suppress the height of the semiconductor device 102 in a region along the other long side to be low.

Furthermore, a configuration in which the resistive elements 12 are disposed only on the front surface layer side of the substrate 8 and two NAND memories 10 are connected to one resistive element 12, and an effect thereof are the same as those described in the first modification of the first embodiment.

Figure 17:
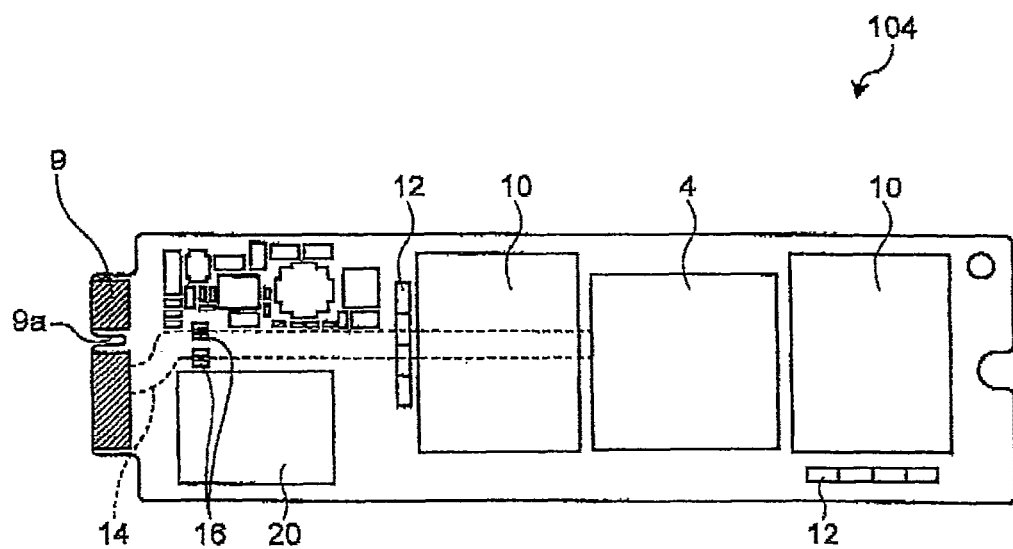
FIG. 17 is a plan view illustrating a schematic configuration of a semiconductor device according to a fourth embodiment.

FIG. 17 is a plan view illustrating a schematic configuration of a semiconductor device according to a fourth embodiment. The same components as the above-mentioned embodiments are denoted by identical reference symbols and a detailed description thereof is omitted. In the embodiment, on a connector 9 side relative to a drive control circuit 4, one NAND memory 10 is disposed, and on the opposite side, one NAND memory 10 is further disposed. That is, a semiconductor device 104 has two NAND memories 10.

In a case of disposing two NAND memories 10 with the drive control circuit 4 interposed therebetween as the embodiment, it is possible to make the lengths of multiple wiring lines connecting the drive control circuit 4 and the NAND memories 10 substantially the same. Meanwhile, similarly, in a case of disposing two NAND memories 10 side by side on one side of the drive control circuit 4, the ratio of the shortest wiring line to the longest wiring line is about 1:2.

As described above, in the invention, the lengths of the multiple wiring lines are made substantially the same, and thus it is also possible to make optical driver setting for the NAND memories 10 substantially the same. Therefore, it is possible to suppress error generation of data and to stabilize the operation of the semiconductor device 104.

Also, similarly to the third embodiment, the SATA signal lines 14 are formed in the inside layers of the substrate 8. Further, since the NAND memories 10 are disposed on one long side of the substrate 8, it is possible to suppress the height of the semiconductor device 104 in a region along the other long side to be low. Furthermore, the resistive elements 12 are disposed in the vicinities of the NAND memories 10 and thus it is possible to suppress deterioration of the performance characteristic of the semiconductor device 104.

Figure 18:
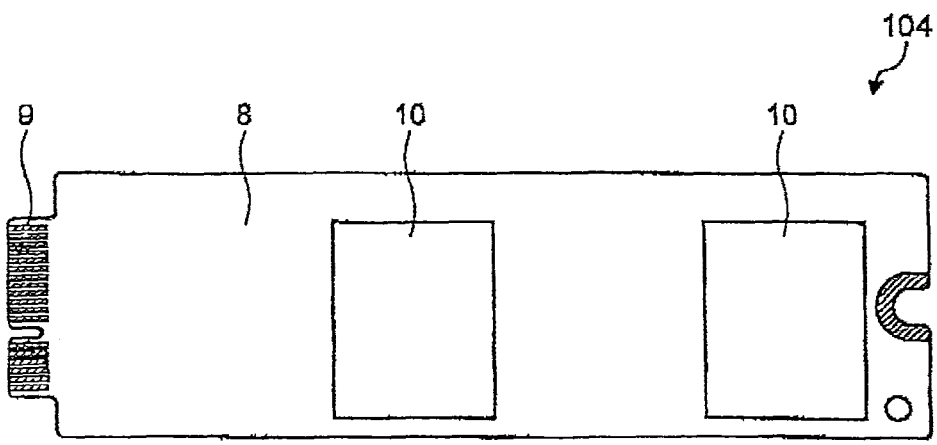
FIG. 18 is a bottom view illustrating a schematic configuration of a semiconductor device according to a first modification of the fourth embodiment.

FIG. 18 is a bottom view illustrating a schematic configuration of the semiconductor device according to a first modification of the fourth embodiment. In the first modification, similarly to the first modification of the first embodiment, NAND memories 10 are disposed on the rear surface layer side of the substrate 8 to be symmetric to the NAND memories 10 disposed on the front surface layer side. Therefore, it is possible to increase the memory capability of the semiconductor device 104.

Further, since the NAND memories 10 are disposed to be symmetric to the NAND memories 10 disposed on the front surface layer side of the substrate 8, even on the rear surface layer side of the substrate 8, the NAND memories 10 are disposed on one long side. Therefore, it is possible to suppress the height of the semiconductor device 104 in a region along the other long side to be low.

Furthermore, a configuration in which the resistive elements 12 are disposed only on the front surface layer side of the substrate 8 and two NAND memories 10 are connected to one resistive element 12, and an effect thereof are the same as those described in the first modification of the first embodiment.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the sprit of the inventions. The accompanying claims and their equivalents are intended to cover such forms or modifications as would fall within the scope and spirit of the inventions.

What is claimed is:

1. A semiconductor device comprising:
   a volatile semiconductor memory;
   first to n-th nonvolatile semiconductor memories (n is an integer equal to or larger than two), each including a plurality of ball-shaped electrodes on a bottom surface;
   a controller configured to control the volatile semiconductor memory and the first to n-th nonvolatile semiconductor memories;
   first to n-th circuit elements, each including a first electrode, a second electrode, a film provided between the first electrode and the second electrode, and a coat covering the film; and
   a connector for connecting to an external device;
   a multilayer wiring substrate on which the volatile semiconductor memory, the first to n-th nonvolatile semiconductor memories, the first to n-th circuit elements, the controller, and the connector are mounted, the multilayer wiring substrate being shaped as a rectangle in a plan view, the connector being provided on a short side of the rectangle, wherein
   the first to n-th nonvolatile semiconductor memories are aligned on a line in a longitudinal direction of the multilayer wiring substrate,
   the controller is provided, in a plan view, between the connector and the first to n-th nonvolatile semiconductor memories,
   the multilayer wiring substrate includes
      a front surface layer with a wiring pattern formed thereon, the front surface layer being a layer on which the volatile semiconductor memory, the first to n-th nonvolatile semiconductor memories, and the controller are mounted;

a rear surface layer with a wiring pattern formed thereon, the rear surface layer being a layer on which (n+1)-th to 2n-th nonvolatile semiconductor memories each including a plurality of ball-shaped electrodes on a bottom surface are mounted such that the (n+1)-th to 2n-th nonvolatile semiconductor memories are symmetric to the first to n-th nonvolatile semiconductor memories with respect to the multilayer wiring substrate, a plurality of internal wiring layers that is provided between the front surface layer and the rear surface layer, the plurality of internal wiring layers having a wiring pattern formed thereon, first to n-th signal lines that connect the controller to the first to n-th circuit elements, respectively;

(n+1)-th to 2n-th signal lines that connect the first to n-th circuit elements to the first to n-th nonvolatile semiconductor memories, respectively, the (n+1)-th to 2n-th signal lines having a part that passes through the internal wiring layers; and (2n+1)-th to 3n-th signal lines that branch from the (n+1)-th to 2n-th signal lines and connect the (n+1)-th to 2n-th nonvolatile semiconductor memories, respectively.

2. The semiconductor device according to claim 1, wherein
each of the (n+1)-th to 2n-th signal lines includes a signal line formed on a first wiring layer that is one of the plurality of internal wiring layers and a signal line formed on a second wiring layer that is one of the plurality of internal wiring layers, the second wiring layer being a different wiring layer from the first wiring layer.

3. The semiconductor device according to claim 2, wherein
each of the (n+1)-th to 2n-th signal lines includes a part that extends almost perpendicular to a front surface of the multilayer wiring substrate to connect the signal line formed on the first wiring layer and the signal line formed on the second wiring layer.

4. The semiconductor device according to claim 1, wherein
the multilayer wiring substrate is configured such that, in a plan view, a region provided with a (3n+1)-th signal line and a region provided with the volatile semiconductor memory do not overlap each other, the (3n+1)-th signal line connecting the controller to the connector.

5. The semiconductor device according to claim 4, wherein the (3n+1)-th signal line is a SATA signal line.

6. The semiconductor device according to claim 4, wherein the connector includes an electrode to be connected to the external device on the rear surface layer of the multilayer wiring substrate, and
the (3n+1)-th signal line includes a part connected to the electrode of the connector through the rear surface layer of the multilayer wiring substrate and a part formed in one of the plurality of internal wiring layers.

7. The semiconductor device according to claim 1, wherein
the volatile semiconductor memory and the connector are provided on the same side of the multilayer wiring substrate relative to the first to n-th nonvolatile semiconductor memories in a plan view.

8. The semiconductor device according to claim 1, further comprising:
a temperature sensor.

9. The semiconductor device according to claim 1, wherein
each the first to n-th signal lines includes a first part, a second part, and a third part,
the first part is formed on the front surface layer,
the second part is formed on the rear surface layer, and
the third part extends almost perpendicular to a front surface of the multilayer wiring substrate to connect the first part and the second part.

10. The semiconductor device according to claim 1, wherein
the number of layers in the multilayer wiring substrate is eight.

11. The semiconductor device according to claim 1, wherein
a k-th nonvolatile semiconductor memory (k is an integer satisfying 1≤k≤n) of the first to n-th nonvolatile semiconductor memories is configured to determine whether to operate in response to a signal from an (n+k)-th signal line of the (n+1)-th to 2n-th signal lines based on a chip enable signal of the k-th nonvolatile semiconductor memory.

12. The semiconductor device according to claim 1, further comprising:
a power supply circuit that is mounted on the multilayer wiring substrate, wherein
the power supply circuit is configured to generate internal voltages on the basis of power supplied from the outside via the connector and to supply the generated internal voltages to the first to n-th nonvolatile semiconductor memories.

13. The semiconductor device according to claim 12, wherein
the connector is connectable to a host, and
the connector is configured to supply power input from the host to the power supply circuit.

14. The semiconductor device according to claim 1, wherein the integer n is four.

* * * * *